(12) United States Patent
Furuuchi et al.

(10) Patent No.: US 6,566,995 B2
(45) Date of Patent: May 20, 2003

(54) PROTECTIVE ELEMENT

(75) Inventors: Yuji Furuuchi, Kanuma (JP); Masami Kawazu, Kanuma (JP)

(73) Assignee: Sony Chemicals Corporation, Tokyo (JP)

(*) Notice: Subject to any disclaimer, the term of this patent is extended or adjusted under 35 U.S.C. 154(b) by 112 days.

(21) Appl. No.: 09/845,334

(22) Filed: May 1, 2001

(65) Prior Publication Data

US 2002/0014945 A1 Feb. 7, 2002

(30) Foreign Application Priority Data

May 17, 2000 (JP) .................................. 2000-145692

(51) Int. Cl.$^7$ .................... H01H 85/08; H01H 85/055
(52) U.S. Cl. ........................ 337/183; 337/182; 337/153; 337/160; 337/295; 337/416
(58) Field of Search .................... 337/153, 154, 337/182–185, 159, 160, 290, 295, 296, 404, 405, 416; 219/517

(56) References Cited

U.S. PATENT DOCUMENTS

| | | | | |
|---|---|---|---|---|
| 3,839,692 A | * | 10/1974 | Plasko | 219/517 |
| 4,504,817 A | * | 3/1985 | Shikama et al. | 315/8 |
| 4,821,010 A | * | 4/1989 | Plasko | 337/183 |
| 5,097,247 A | * | 3/1992 | Doerrwaechter | 29/623 |
| 5,153,805 A | * | 10/1992 | Tennant et al. | 361/106 |
| 5,386,335 A | * | 1/1995 | Amano et al. | 338/20 |
| 5,621,602 A | * | 4/1997 | Winkelmann | 337/184 |
| 5,939,969 A | * | 8/1999 | Doerrwaechter et al. | 337/152 |
| 5,963,122 A | * | 10/1999 | Endo et al. | 337/166 |
| 6,011,458 A | * | 1/2000 | Endo et al. | 337/166 |
| 6,144,283 A | * | 11/2000 | Matsumura | 29/623 |
| 6,300,859 B1 | * | 10/2001 | Myong et al. | 337/14 |
| 6,373,371 B1 | * | 4/2002 | Doerrwaechter et al. | 29/623 |

FOREIGN PATENT DOCUMENTS

| | | | | |
|---|---|---|---|---|
| GB | 2181811 A | * | 4/1987 | .......... B08B/9/02 |
| JP | 2-288126 A | * | 11/1990 | .......... H01H/37/76 |
| JP | 3-280317 A | * | 12/1991 | .......... H01H/37/76 |
| JP | 8-161990 | | 6/1996 | |
| JP | 10-116549 | | 5/1998 | |
| JP | 10-116550 | | 5/1998 | |
| JP | 2790433 | | 6/1998 | |
| JP | 2000-285778 | | 10/2000 | |
| JP | 2000-306477 | | 11/2000 | |

* cited by examiner

*Primary Examiner*—Anatoly Vortman
(74) *Attorney, Agent, or Firm*—Oliff & Berridge, PLC

(57) ABSTRACT

A protective element contains a heat-generating member and a low melting metal member on a substrate, in which the low melting metal member is molten by the heat generated by the heat-generating member and flows onto electrodes, which causes the low melting metal member to blow out, Formula (1) below is satisfied:

(cross-sectional area of the low melting metal member)/(surface area of the blowout-effective electrode)$\leq 0.15$     (1)

Alternatively, Formula (2) below is satisfied:

$2.5 \leq$(inter-electrode distance)/(cross-sectional area of the low melting metal member)$\leq 30$     (2)

wheren the inter-electrode distance is defined as the distance between two electrodes, among the low melting metal member electrodes onto which the molten low melting metal member flows, which are adjacent to each other with the low melting metal member interposed therebetween.

2 Claims, 3 Drawing Sheets

(x−x Sectional View)

(x-x Sectional View)

(y-y Sectional View)

PROTECTIVE ELEMENT

BACKGROUND OF THE INVENTION

1. Field of the Invention

The present invention relates to a protective element wherein a heat-generating member generates heat under abnormal circumstances, which causes a low melting metal member to blow out.

2. Description of the Related Art

Protective elements comprising heat-generating members and low melting metal members layered on a substrate are known to be able to prevent overvoltages as well as overcurrents (e.g. Japanese Patent No. 2790433 and Japanese Patent Application Laid-open No. H8-161990). Such protective elements contain heat-generating members through which electricity is passed in abnormal circumstances, and the heat generated by these members melts the low melting metal. The surface of the electrode on which the low melting metal member is disposed is thereby wetted, which causes the low melting metal member to blow out.

FIG. 1 is a circuit diagram showing an example of an overvoltage-preventing device which utilises such a protective element 1p. FIGS. 2A and 2B shows respectively a plane view and a sectional view of the protective element 1p.

The protective element 1p has a structure comprising heat-generating members 3, on which a resist paste has been applied, an insulating layer 4, and a low melting metal member 5 comprising a fuse material, all of which are layered on a substrate 2. In the drawings, 6a and 6b are electrodes for the heat-generating members; the electrode 6b is connected to an electrode in the central portion of the low melting metal member 5 (intermediate electrode 7c), with the connection site being situated between two sites 5a and 5b into which the low melting metal member 5 has been divided. 7a and 7b are electrodes for the low melting metal member. 8 is a internal sealing component made from solid flux, with which the low melting metal member 5 is sealed to prevent its surface from oxidising, and 9 is an external sealing component comprising a material which has higher melting and softening points than the low melting metal member 5 and which prevents the molten low melting metal member 5 from flowing out of the protective element once it has blown out.

In the overvoltage preventing device shown in FIG. 1, which uses the protective element 1p, terminals A1 and A2 are connected to electrode terminals on the device to be protected; e.g. a lithium-ion battery, while terminals B1 and B2 are connected to electrode terminals of devices such as a charging device connected to the device to be protected. According to the overvoltage preventing device, when the charging of the lithium-ion battery proceeds and an overvoltage that is larger than the breakdown voltage is applied to a Zehner diode D, an abrupt base current $i_b$ will flow and cause a large collector current $i_c$ to flow through the heat-generating members 3 and thereby cause the heat-generating members 3 to heat up. This heat is transmitted to the low melting metal member 5 on the heat-generating members 3, causing the two sites 5a and 5b of the low melting metal member 5 to blow out. This prevents any overvoltage from being applied to the terminals A1 and A2 and simultaneously interrupts the current flowing to the heat-generating members 3.

An example of an embodiment of connection between the low melting metal member and heat-generating member in such types of protective elements is taught in Japanese Patent Application Laid-Open No. H10-116549 and Japanese Patent Application Laid-Open No. H10-116550, wherein the low melting metal member and the heat-generating member are connected while being disposed in planar fashion on the substrate, instead of the low melting metal member being layered on top of the heat-generating member. Nevertheless, the merit of having the flow of electricity to the heat-generating member being interruptible at the same time that the low melting metal member blows out remains the same.

Similarly to the protective element 1p shown in FIG. 1, FIGS. 3A, 3B and 3C depict respectively a plane view (3A) and sectional views (3B, 3C) of a protective element 1q, in which the heat generated from a flow of electricity passing through a heat-generating member 3 causes a low melting metal member 5 to blow out and the flow of electricity destined for the heat-generating member 3 to be simultaneously interrupted (Japanese Patent Application No. H11-110163). Low melting metal member electrodes 7a, 7b and 7c are furnished on a substrate 2 in this protective element 1q, and a low melting metal member 5 (5a, 5b) is disposed so as to bridge these electrodes 7a, 7b and 7c. A heat-generating member 3 is furthermore furnished on the underside of the electrode 7c, with an insulating layer 4 interposed therebetween. The heat-generating member 3 is heated by the flow of electricity passed between the heat-generating member electrode 6b and the leads 6x and 6y coming from the heat-generating member electrode 6a. The heat-generating member electrode 6b is connected to the low melting metal member electrode 7c. Accordingly, the heat generated by the heat-generating member 3 causes both the low melting metal member 5a between the electrodes 7a and 7c and the low melting metal member 5b between the electrodes 7b and 7c to blow out, and thereby interrupt the flow of electricity passed to the device to be protected, while also interrupting the flow of electricity transmitted to the heat-generating member 3.

However, even if the heat generated by the heat-generating member 3 melts the low melting metal member 5 in the aforedescribed conventional protective elements 1p and 1q, the drawback arises that if the surface areas of the low melting metal member electrodes 7a, 7b and 7c are too narrow, the molten low melting metal member 5 will not flow sufficiently onto these electrodes and the low melting metal member 5 shall not blow out.

The drawback will also arise, moreover, that if the distance between adjacent electrodes (inter-electrode distance) with the low melting metal member 5 interposed therebetween is too small, the low melting metal member will not blow out despite being melted by the heat generated by the heat-generating member 3 has melted it. Conversely, if the inter-electrode distance is too great, the heat generated when the low melting metal member 5 has been connected to the substrate 2 will create a drawback that the low melting metal member 5 will become thin in specific areas, and moreover, the anti-pulse property will diminish whether or not the resistance value remains constant. Last, another drawback will arise when the inter-electrode distance is further increased, as the low melting metal member 5 will blow out when it is bonded to the substrate by thermocompression or the like.

SUMMARY OF THE INVENTION

With the foregoing problems in view, it is an object of the present invention to provide a protective element comprising a heat-generating member and a low melting metal member on a substrate, in which the low melting metal member is molten by the heat generated by the heat-generating member and flows onto electrodes, the low melting metal member being thereby caused to blow out, wherein the manufacturing stability and reliability of the protective element is enhanced by optimising both the surface area and the inter-electrode distance of the electrodes to which the molten low melting metal member flows when the heat is generated by the heat-generating member.

In achieving the aforedescribed object, the present invention provides a protective element comprising a heat-generating member and a low melting metal member on a substrate, in which the low melting metal member is molten by the heat generated by the heat-generating member and flows onto electrodes, whereby the low melting metal member is blown out, the protective element being characterised in that Formula (1) below is satisfied for at least one of the electrodes onto which the molten low melting metal flows:

$$\text{(cross-sectional area of the low melting metal member)/(blowout effective electrode surface area)} \leq 0.15 \quad (1)$$

where the cross-sectional area of the low melting metal member is defined as an average value of the cross-sectional areas of the planes established perpendicularly with respect to the direction of the current which flows through the low melting metal member, and the blowout effective electrode surface area is defined as the surface area of the electrodes which can be wetted by the molten low melting metal member which flows onto the electrodes, in one minute after the low melting metal member has been completely molten and started to flow. The present invention further provides a protective element comprising a heat-generating member and a low melting metal member on a substrate, in which the low melting metal member is molten by the heat generated by the heat-generating member and flows onto electrodes, whereby the low melting metal member is blown, the protective element being characterised in that Formula (2) below is satisfied:

$$2.5 \leq \text{(inter-electrode distance)/(cross-sectional area of the low melting metal member)} \leq 30 \quad (2)$$

where the cross-sectional area of the low melting metal member is defined as an average value of the cross-sectional areas of the planes established perpendicularly with respect to the direction of the current which flows through the low melting metal member, and the inter-electrode distance is defined as the distance between two electrodes, from among the electrodes onto which the molten low melting metal member flows, which are adjacent to each other with the low melting metal member interposed therebetween.

The cross-sectional area of the low melting metal member, as described in the foregoing, is defined as the cross-sectional area of the low melting metal member at a surface which is established perpendicularly to the direction of the current which flows through the low melting metal member. Should the cross-sectional area, however, not be constant with respect to the direction of the current flowing through the low melting metal member, then it should be defined as the value obtained by taking an average of the cross-sectional areas in the direction of the current.

The blowout effective electrode surface area is defined as the surface area of the electrode which is wetted by the low melting metal member one minute after it has completely melted and started to flow. When there is a plurality of electrodes which the molten low melting metal member is able to wet, then Formula (1) should be satisfied for at least one of the electrodes.

The blowout effective electrode surface area is normally equal to the total surface area of the electrodes onto which the molten low melting metal member flows. However, when the total surface area of the electrodes is greater than the surface area which can be wetted by the molten low melting metal member one minute after it starts to flow, then the blowout effective electrode surface area shall be defined as a portion of the total electrode surface area.

The protective element pertaining to the present invention is formed so as to satisfy the aforedescribed Formulae (1) and (2), which enables its reliability as a protective element to be improved, since the heat generated by the heat-generating member will cause the low melting metal member to blow out quickly. The manufacturing stability of the protective element can also be enhanced accordingly.

DETAILED DESCRIPTION OF THE INVENTION

Figure 1:
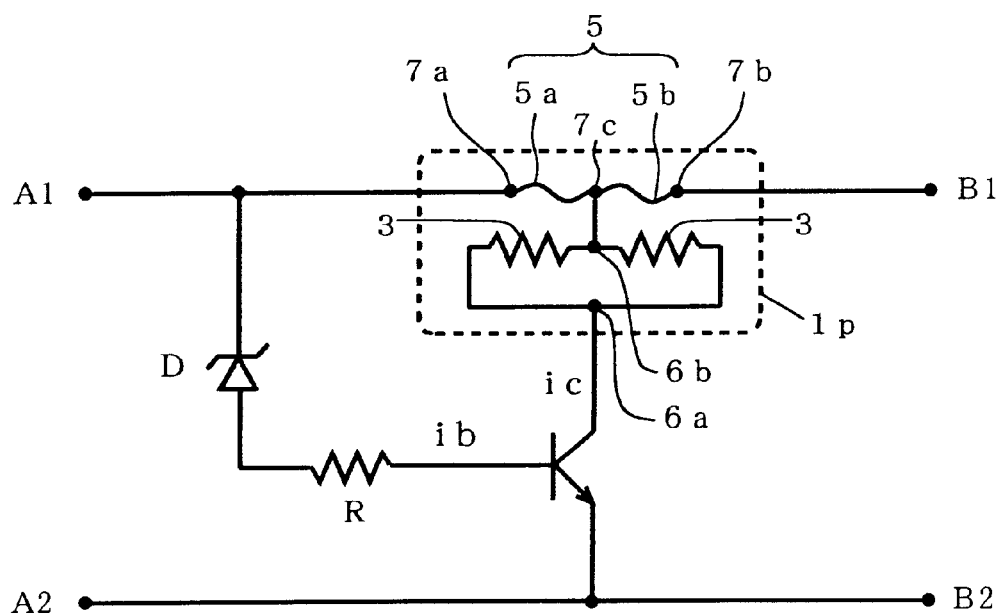
FIG. 1 is a circuit diagram of a protective element.

The present invention is described in further detail below by reference to the drawings. The designations in the drawings, where identical, refer to the same or similar structural elements.

The protective element pertaining to the present invention comprises a heat-generating member and a low melting metal member on a substrate, with the heat generated by the heat-generating member causing the low melting metal member to melt and flow onto an electrode, which causes the low melting metal member to blow out, wherein the cross-sectional area of the low melting metal member and the surface area of the electrodes onto which the molten low melting metal member flows are appropriately set so as to satisfy Formula (1) below;

$$\text{(cross-sectional area of the low melting metal member)/(blowout effective electrode surface area)} \leq 0.15 \quad (1)$$

or alternatively, the spacing between adjacent electrodes onto which the molten low melting metal member flows and the cross-sectional area of the low melting metal member are appropriately set so as to satisfy Formula (2) below.

$$2.5 \leq \text{(inter-electrode distance)/(cross-sectional area of the low melting metal member)} \leq 30 \quad (2)$$

Preferably, the cross-sectional area of the low melting metal member, the surface area of the electrodes onto which the molten low melting metal member flows and the spacing between adjacent electrodes onto which the molten low melting metal member flows are set appropriately so as to satisfy both Formulae (1) and (2).

Figure 2A:
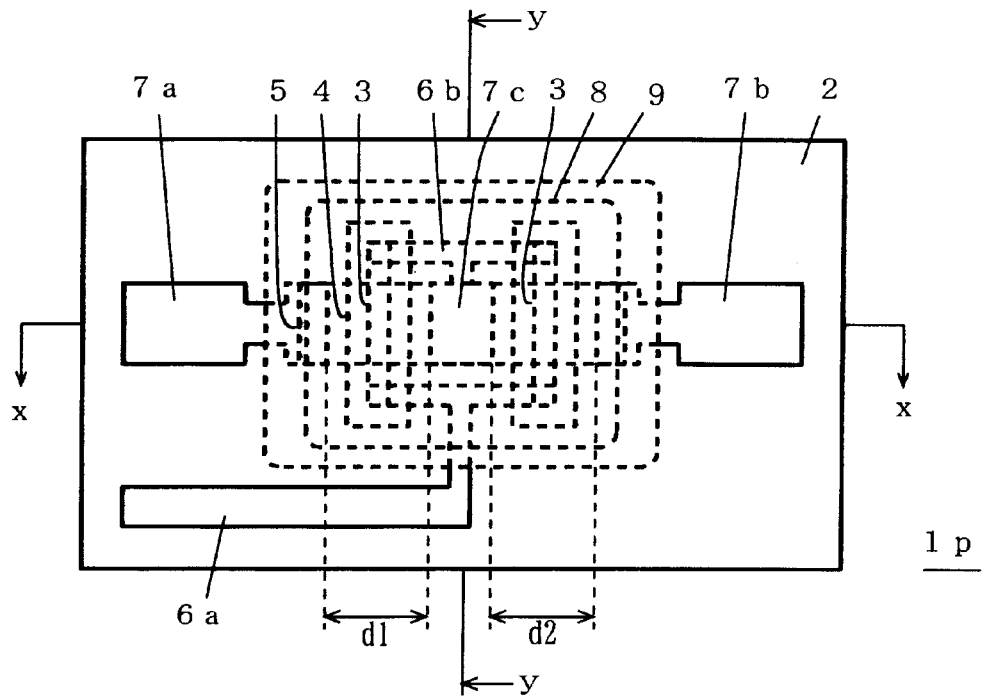
FIGS. 2A and 2B are respectively a plane view and a sectional view of a protective element.
Figure 2B:
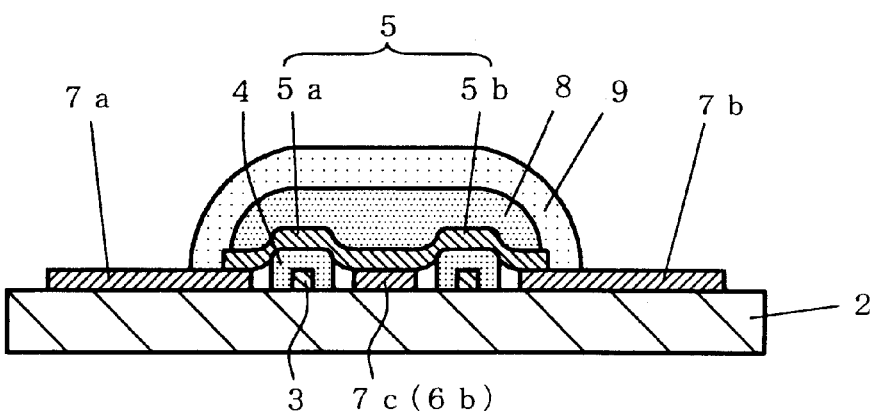

More specifically, the area of the cross-sectional area of the low melting metal member 5 along the y—y direction is set as the cross-sectional area of the low melting metal member 5 in the protective element 1p shown in FIGS. 2A and 2B so as to satisfy the aforedescribed Formulae (1) and (2). The blowout effective electrode surface area is set so as to satisfy the aforedescribed formulae for at least one electrode among the low melting metal member electrodes 7*a*, 7*b* and 7*c* onto which the molten low melting metal member 5 flows, and the inter-electrode distance is set such that the distance d1 between the low melting metal member electrodes 7*a* and 7*c* is the same as the distance d2 between the low melting metal member electrodes 7*a*, 7*c*.

Figure 3A:
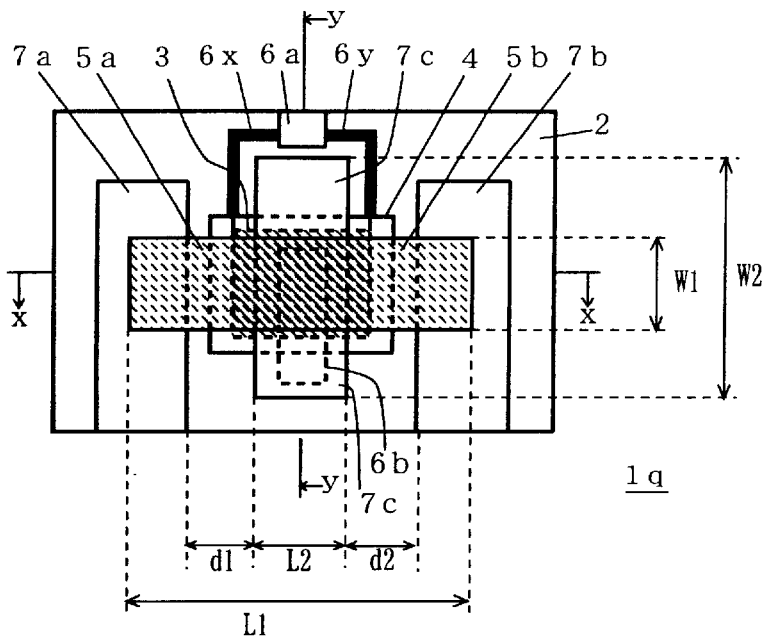
FIGS. 3A, 3B and 3C are respectively a plane view (3A) and sectional views (3B, 3C) of a protective element.
Figure 3B:
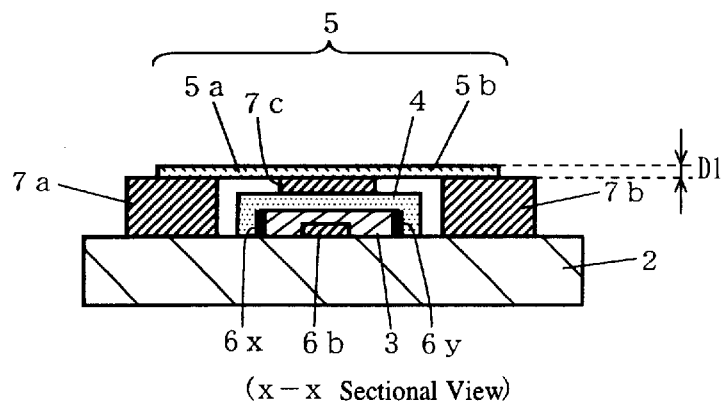
Figure 3C:
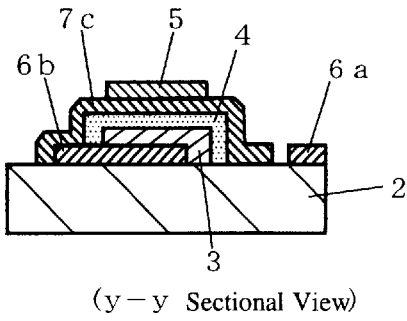

The area of the cross-sectional area of the low melting metal member 5 along the y—y direction is set as the cross-sectional area of the low melting metal member 5 in the protective element 1*q* shown in FIGS. 3A to 3C so as to satisfy the aforedescribed Formulae (1) and (2). The blowout effective electrode surface area is set so as to satisfy the aforedescribed formulae for the surface area of at least one electrode among the low melting metal member electrodes 7*a*, 7*b* and 7*c* onto which the molten low melting metal member 5 flows, and the inter-electrode distance is set such that the distance dl between the low melting metal member electrodes 7*a* and 7*c* is the same as the distance d2 between the low melting metal member electrodes 7*a*, 7*c*.

The designs above will ensure that blowout will occur when the low melting metal member 5 melts, thereby enhancing the reliability of operation as a protective element. Furthermore, the manufacturing stability of the protective element shall be enhanced, since any rupturing due to the thinness of the low melting metal member in specific areas caused during its manufacture is prevented.

There are no particular limitations on the individual structural materials used for the low melting metal member, electrodes, heat-generating member or substrate in the protective element pertaining to the present invention, nor on the positioning of same, provided that the aforedescribed Formulae (1) and (2) are satisfied. For example, any of various low melting metal members which have conventionally been used as fuses can be used as the material for forming the low melting metal member 5; e.g., an alloy selected from Table 1 in paragraph (0019) in Japanese Patent Application Laid-Open No. H8-161990. The low melting metal member may assume the form of a thin strip or a rod.

There are no particular limitations on the structural materials used for electrodes into which molten low melting metal member 5 such as the low melting metal member electrodes 7*a*, 7*b* and 7*c* used in the protective element 1*p* shown in FIGS. 2A and 2B, nor in the low melting metal member electrodes 7*a*, 7*b* and 7*c* used in the protective element 1*q* shown in FIGS. 3A to 3C either. It is preferable to use a material which has good wettability with respect to the molten low melting metal member 5. Examples include copper or another single metallic material, with or without a surface of Ag—Pt, Au, Ag—Pd or the like.

The heat-generating member 3 can be formed by applying a resist paste comprising an electrically conductive material such as ruthenium oxide or carbon black and an inorganic binder such as water glass or an organic binder such as a thermosetting resin and, if necessary, by baking the same. The heat-generating member 3 can also be formed by printing, plating, vapour-depositing or sputtering a thin film comprising ruthenium oxide or carbon black, or gluing or laminating these films.

There is no particular limitation to the substrate 2; plastic films, glass epoxy substrates, ceramic substrates and metal substrates can be used. An inorganic substrate is preferable.

The insulating layer 4 is a layer which provides insulation between the heat-generating member 3 and the low melting metal member 5 and can comprise e.g. epoxy, acrylic or polyester or any of other various organic resins, or an inorganic material which contains $SiO_2$ as the principal component. When the insulating layer 4 is formed from an organic resin, an inorganic powder which has high thermal conductivity can be used, so as to allow the heat generated by the heat-generating member 3 to pass efficiently to the low melting metal member 5.

The protective element pertaining to the present invention has been described in detail in the foregoing with reference to the drawings; however, the present invention may assume various other embodiments. For example, as necessity demands, the number of low melting metal members may be increased, and the number of electrodes onto which the molten low melting metal member flows may also be increased. An insulating layer 4 is furnished on the heat-generating member 3 in the protective elements 1*p* and 1*q* shown in the drawings; however, this insulating layer 4 may be eliminated (Japanese Patent Application No. H11-94385). Furthermore, as taught in Japanese Patent Application Laid-Open No. H10-116549 and Japanese Patent Application Laid-Open No. H10-116550, the heat-generating member 3 and the low melting metal member 5 may be disposed planarly on the substrate 2.

In order to prevent oxidation of the surface of the low melting metal member 5, an internal sealing component comprising solid flux or the like can be furnished thereon, and on its exterior can be furnished an external sealing component or cap for preventing the low melting metal member 5 from melting and flowing out from the protective element, once it has blown out.

EXAMPLES

The present invention shall be described in further detail with the aid of working examples.

Working Examples 1 to 8; Comparative Examples 1 to 8

The protective element 1*q* shown in FIGS. 3A to 3C was prepared as described below. Low melting metal member electrodes 7*a* and 7*b* and heat-generating member electrodes 6*a* and 6*b* were formed on an alumina substrate (size: 3 mm×5 mm) which had been prepared for use as the substrate 2. A silver paste (Du Pont Company; QS174) was accordingly printed thereon, and baked for 30 minutes at 870° C. In order to form a heat-generating member 3, a ruthenium oxide resist paste (Du Pont Company; DP1900) was printed and baked for 30 minutes at 870° C. (thickness: 10 $\mu$m; size: 0.1 mm×2.0 mm). A silica insulating paste (Du Pont Company; AP5346) was then printed on the heat-generating member 3 and baked for 30 minutes at 500° C. to form an insulating layer 4. A low melting metal member electrode 7*c* was formed on the insulating layer 4 in a similar manner to the aforedescribed low melting metal member electrodes 7*a* and 7*b*. A solder paste (Sn:Pb=90:10) is applied onto the low melting metal member electrodes 7*a*, 7*b* and 7*c*, and a solder foil (Sn:Pb=5:95) (width W1=1 mm; length L1=4.2 mm) is thermocompression bonded thereonto as the low melting metal member 5.

In this case, the width W2, length L2 and surface area of the low melting metal member electrodes 7*c* were changed as shown in Table 1. The cross-sectional area of the solder foil in the y—y direction was changed by varying the thickness D1 of the solder foil, as shown in Table 1.

A 4 W (power value) was applied to the heat-generating members 3 of each of the resulting protective element working examples and comparative example to cause the heat-generating members 3 to generate heat (operating at 4 W) and the solder foil (low melting metal member 5) to blow out, whereupon the time elapsed from the application of the 4 W until the solder foils fused was measured. Members which blew out within 20 sec under operation at 4 W were assessed as "OK", and those which either took longer than 20 sec to blow out or did not blow out at all were assessed as "NG". The results are shown in Table 1.

TABLE 1

| | Electrode | | | Solder foil | | Assess-ment OK or NG |
|---|---|---|---|---|---|---|
| | L2 (mm) | W2 (mm) | SA: surface area (mm$^2$) | CA: Cross-Sectional area (mm$^2$) | CA/SA | |
| Ex. 1 | 0.3 | 1.5 | 0.45 | 0.02 | 0.044 | OK |
| Ex. 2 | 0.4 | 1.5 | 0.60 | 0.06 | 0.100 | OK |
| Ex. 3 | 0.5 | 1.5 | 0.75 | 0.06 | 0.080 | OK |
| Ex. 4 | 0.7 | 1.5 | 1.05 | 0.15 | 0.143 | OK |
| Ex. 5 | 0.9 | 1.8 | 1.62 | 0.20 | 0.123 | OK |
| Ex. 6 | 1.4 | 2.52 | 2.52 | 0.30 | 0.119 | OK |
| Ex. 7 | 1.4 | 2.0 | 2.80 | 0.30 | 0.107 | OK |
| Ex. 8 | 1.6 | 2.0 | 3.20 | 0.40 | 0.125 | OK |
| Comp. Ex. 1 | 0.3 | 1.5 | 0.45 | 0.08 | 0.178 | NG |
| Comp. Ex. 2 | 0.4 | 1.5 | 0.60 | 0.10 | 0.167 | NG |
| Comp. Ex. 3 | 0.5 | 1.5 | 0.75 | 0.15 | 0.200 | NG |
| Comp. Ex. 4 | 0.7 | 1.5 | 1.05 | 0.18 | 0.171 | NG |
| Comp. Ex. 5 | 0.9 | 1.8 | 1.62 | 0.30 | 0.185 | NG |
| Comp. Ex. 6 | 1.4 | 1.8 | 2.52 | 0.40 | 0.159 | NG |
| Comp. Ex. 7 | 1.4 | 2.0 | 2.80 | 0.50 | 0.179 | NG |
| Comp. Ex. 8 | 1.6 | 2.0 | 3.20 | 0.50 | 0.156 | NG |

The results shown in Table 1 show that the protective elements pertaining to Working Examples 1 to 8, in which the value obtained by dividing the cross-sectional area of solder foil by the surface area of electrode was 0.15 or less, blew out stably under operation at 4 W, while the protective elements pertaining to Comparative Examples 1 to 8, in which the value obtained by dividing the cross-sectional area of solder foil by the surface area of electrode exceeded 0.15, did not blow out under operation at 4 W, thus proving unreliable as protective elements.

Working Examples 9 to 14 and Comparative Examples 9 to 14

Protective elements 1q, as shown in FIGS. 3A to 3C, were manufactured according to Working Example 1. In these examples, 3 mm×5 mm to 3 mm×9 mm alumina substrates were employed. The width W1 of the solder foil was 1 mm, and the length L1 was the distance between the low melting metal member electrodes 7a and 7b plus 0.5 mm. The low melting metal member electrodes 7a, 7b, 7c were in all cases 1 mm in length L2 and 2 mm in width W2. The distances between the low melting metal member electrodes 7a and 7c (d1) and 7b and 7c (d2) were equal for all the values shown in Table 2.

The resulting protective elements pertaining to the working and comparative examples were visually assessed, and those in which the solder foils (low melting metal members 5) exhibited locally thinned sections the cross-sectional area of which was 75% or less of the initial cross section were assessed as "NG". For those elements which were not assessed as "NG", 4 W (power value) was applied to the heat-generating members 3 to cause them to generate heat under operation at 4 W, whereupon the time elapsed from the application of the 4 W power until the blowout of the solder foils was measured. Members which blew out within 20 seconds under operation at 4 W were assessed as "OK", and those which either took longer than 20 seconds to blow out or did not blow at all were assessed as "NG". The results are shown in Table 2.

TABLE 2

| | Solder foil CS: Cross-sectional area (mm$^2$) | ID: Inter-electrode distance (mm) | ID/CS (mm$^{-1}$) | Assessment OK or NG |
|---|---|---|---|---|
| Ex. 9 | 0.02 | 0.6 | 30.0 | OK |
| Ex. 10 | 0.04 | 0.6 | 15.0 | OK |
| Ex. 11 | 0.06 | 1.0 | 16.7 | OK |
| Ex. 12 | 0.15 | 0.4 | 2.7 | OK |
| Ex. 13 | 0.20 | 0.6 | 3.0 | OK |
| Ex. 14 | 0.50 | 1.5 | 3.0 | OK |
| Comp. Ex. 9 | 0.02 | 1.0 | 50.0 | NG*1 |
| Comp. Ex. 10 | 0.04 | 1.5 | 37.5 | NG*2 |
| Comp. Ex. 11 | 0.06 | 2.0 | 33.3 | NG*2 |
| Comp. Ex. 12 | 0.15 | 0.2 | 1.3 | NG*3 |
| Comp. Ex. 13 | 0.20 | 0.4 | 2.0 | NG*3 |
| Comp. Ex. 14 | 0.50 | 1.0 | 2.0 | NG*4 |

*1solder foil blew out during thermocompression bonding
*2solder foil displayed locally thinned sections the cross-sectional area of which was 75% or less of the initial cross-sectional area
*3did not blow out, even 60 seconds after the start of operation at 4 W
*4blew out 40 seconds after the start of operation at 4 W The results shown in Table 2 show that the protective elements pertaining to Working Examples 9 to 14, in which the value obtained by dividing the inter-electrode distance by the surface area of solder foil was in the range of 2.5 to 30, suffered no thinning in specific areas of the solder foils when the protective elements were manufactured, and the foils consistently blew out even under operation at 4 W, while the protective elements pertaining to Comparative Examples 12 to 14, in which the value obtained by dividing the inter-electrode distance by the surface area of solder foil was less than 2.5, blew out inconsistently under operation at 4 W, thus proving unreliable as protective elements. Moreover, in the protective elements pertaining to Comparative Examples 9 to 11, in which the value obtained by dividing the inter-electrode distance by the surface area of solder foil exceeded 30, either the solder foils blew out during the manufacture of the protective elements, or the solder foils were thinned locally, thus not demonstrating manufacturing stability.

The protective element pertaining to the present invention is formed so that the ratio between the cross-sectional area of the low melting metal member and the blowout effective electrode surface area, and the ratio between the inter-electrode distance and the cross-sectional area of the low melting metal member, fall within a specific range; the reliability of its operation as a protective element is thereby enhanced, as is its manufacturing stability.

The entire disclosure of the specification, claims, summary and drawings of Japanese Patent Application No. 2000-145692 filed on May 17, 2000 is hereby incorporated by reference.

What is claimed is:

1. A protective element comprising a heat-generating member and a low melting metal member on a substrate, in which the low melting metal member is molten by the heat generated by the heat-generating member and flows onto electrodes, whereby the low melting metal member is blown out, said protective element being characterised in that Formula (1) below is satisfied for at least one of the electrodes onto which the molten low melting metal flows:

$$\text{(cross-sectional area of the low melting metal member)/(blowout effective electrode surface area)} \leq 0.15 \quad (1)$$

where the cross-sectional area of the low melting metal member is defined as an average value of the cross-sectional areas of the planes established perpendicularly with respect to the direction of the current which flows through the low melting metal member, and the blowout effective electrode surface area is defined as the surface area of the electrodes which can be wetted by the molten low melting metal member which flows onto the electrodes, in one minute after the low melting metal member has been completely molten and started to flow.

2. A protective element comprising a heat-generating member and a low melting metal member on a substrate, in which the low melting metal member is molten by the heat generated by the heat-generating member and flows onto electrodes, whereby the low melting metal member is blown out, said protective element being characterised in that Formula (2) below is satisfied:

$$2.5 \leq \text{(inter-electrode distance)/(cross-sectional area of the low melting metal member)} \leq 30 \quad (2)$$

where the cross-sectional area of the low melting metal member is defined as an average value of the cross-sectional areas of the planes established perpendicularly with respect to the direction of the current which flows through the low melting metal member, and the inter-electrode distance is defined as the distance between two electrodes, from among the electrodes onto which the molten low melting metal member flows, which are adjacent to each other with the low melting metal member interposed therebetween.

* * * * *